United States Patent
Isa et al.

(10) Patent No.: US 11,340,306 B2
(45) Date of Patent: May 24, 2022

(54) LIFETIME ESTIMATION DEVICE, LIFETIME ESTIMATION METHOD, AND ABNORMALITY DETECTION METHOD OF SECONDARY BATTERY

(71) Applicant: SEMICONDUCTOR ENERGY LABORATORY CO., LTD., Atsugi (JP)

(72) Inventors: Toshiyuki Isa, Kanagawa (JP); Akihiro Chida, Kanagawa (JP); Ryota Tajima, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 16/761,289

(22) PCT Filed: Nov. 7, 2018

(86) PCT No.: PCT/IB2018/058726
§ 371 (c)(1),
(2) Date: May 4, 2020

(87) PCT Pub. No.: WO2019/097357
PCT Pub. Date: May 23, 2019

(65) Prior Publication Data
US 2021/0190877 A1    Jun. 24, 2021

(30) Foreign Application Priority Data
Nov. 16, 2017 (JP) .............................. JP2017-221035

(51) Int. Cl.
*G01R 31/392* (2019.01)
*G01R 31/36* (2020.01)
(Continued)

(52) U.S. Cl.
CPC ......... *G01R 31/392* (2019.01); *G01R 31/367* (2019.01); *G01R 31/3648* (2013.01); *G01R 31/374* (2019.01)

(58) Field of Classification Search
CPC .............. G01R 31/392; G01R 31/3648; G01R 31/367; G01R 31/374
See application file for complete search history.

(56) References Cited

U.S. PATENT DOCUMENTS 10,422,837 B2    9/2019 Park et al.
10,444,289 B2   10/2019 You et al.
(Continued)

FOREIGN PATENT DOCUMENTS

CN    106068461 A    11/2016
CN    106249152 A    12/2016
(Continued)

OTHER PUBLICATIONS

Kang et al., "A new neural network model for the state-of-charge estimation in the battery degradation process" Applied Energy 121 (2014) 20-27 (Year: 2014).*

(Continued)

*Primary Examiner* — John C Kuan
(74) *Attorney, Agent, or Firm* — Nixon Peabody LLP; Jeffrey L. Costellia

(57) ABSTRACT

An object is to predict a deterioration state of a secondary battery even in an environment where temperature and a charging voltage change. A lifetime estimation device of the secondary battery includes a measuring unit for measuring the capacity of the secondary battery in the full charging state; a temperature sensing unit for sensing the ambient temperature of the secondary battery; and a storage unit for storing a table of a proportional coefficient corresponding to temperature in advance, and a predicted deterioration line of (Continued)

the secondary battery is calculated with the use of a non-linear regression equation approximated to a measured deterioration line obtained by the measuring unit. The lifetime estimation device may construct a lifetime estimation system with the use of a neural network.

4 Claims, 10 Drawing Sheets

(51) Int. Cl.
  *G01R 31/367* (2019.01)
  *G01R 31/374* (2019.01)

(56) References Cited

U.S. PATENT DOCUMENTS

| | | | |
|---|---|---|---|
| 10,557,892 B2 | 2/2020 | Suzuki et al. | |
| 2012/0235409 A1* | 9/2012 | Zhang | G01R 31/392 290/44 |
| 2014/0089692 A1* | 3/2014 | Hanafusa | H04Q 9/00 713/310 |
| 2016/0363632 A1 | 12/2016 | Park et al. | |
| 2016/0377686 A1 | 12/2016 | Uchida et al. | |
| 2017/0023649 A1 | 1/2017 | You et al. | |
| 2017/0328957 A1 | 11/2017 | Suzuki et al. | |
| 2018/0074129 A1* | 3/2018 | Nakao | B60L 58/18 |
| 2020/0076223 A1 | 3/2020 | Kuriki et al. | |
| 2020/0153264 A1 | 5/2020 | Osada et al. | |

FOREIGN PATENT DOCUMENTS

| | | | |
|---|---|---|---|
| CN | 106371021 A | 2/2017 | |
| CN | 107209228 A | 9/2017 | |
| EP | 3109656 A | 12/2016 | |
| EP | 3121613 A | 1/2017 | |
| EP | 3121614 A | 1/2017 | |
| EP | 3232216 A | 10/2017 | |
| JP | 2013-019730 A | 1/2013 | |
| JP | 2015-154534 A | 8/2015 | |
| JP | 2015-158416 A | 9/2015 | |
| JP | 2017-004955 A | 1/2017 | |
| JP | 2017-026616 A | 2/2017 | |
| JP | 2017-111860 A | 6/2017 | |
| KR | 2016-0146032 A | 12/2016 | |
| KR | 2017-0011010 A | 2/2017 | |
| WO | WO-2015/141500 | 9/2015 | |
| WO | WO-2016/092811 | 6/2016 | |
| WO | WO-2017/104497 | 6/2017 | |
| WO | WO-2018003210 A1 * | 1/2018 | ............... H02J 7/00 |
| WO | WO-2018112818 A1 * | 6/2018 | ............. G01R 31/36 |

OTHER PUBLICATIONS

Micea et al., "Online State-of-Health Assessment for Battery Management Systems" IEEE Transactions on Instrumentation and Measurement, vol. 60, No. 6, Jun. 2011 (Year: 2011).*
Xing et al., "An ensemble model for predicting the remaining useful performance of lithium-ion batteries" Microelectronics Reliability 53 (2013) 811-820 (Year: 2013).*
International Search Report (Application No. PCT/IB2018/058726) dated Feb. 19, 2019.
Written Opinion (Application No. PCT/IB2018/058726) dated Feb. 19, 2019.

* cited by examiner $a = x_1 w_1 + x_2 w_2 + b$

US 11,340,306 B2

LIFETIME ESTIMATION DEVICE, LIFETIME ESTIMATION METHOD, AND ABNORMALITY DETECTION METHOD OF SECONDARY BATTERY

TECHNICAL FIELD

One embodiment of the present invention relates to an object, a method, or a manufacturing method. The present invention relates to a process, a machine, manufacture, or a composition of matter. One embodiment of the present invention relates to a semiconductor device, a display device, a light-emitting device, a power storage device, a lighting device, an electronic device, or a manufacturing method thereof. In particular, one embodiment of the present invention relates to a lifetime estimation method, an abnormality detection method, and a lifetime estimation system of a power storage device.

In this specification, a power storage device is a collective term describing elements and devices having a power storage function. For example, the power storage device includes a storage battery (also referred to as secondary battery) such as a lithium-ion secondary battery, a lithium-ion capacitor, a nickel hydrogen battery, an all-solid battery, an electric double layer capacitor, and the like.

BACKGROUND ART

In recent years, a variety of power storage devices such as lithium-ion secondary batteries, lithium-ion capacitors, and air batteries have been actively developed. In particular, demand for lithium-ion secondary batteries with high output and high energy density has rapidly grown with the development of the semiconductor industry, and the lithium-ion secondary batteries are essential as rechargeable energy supply sources for the current information society. The lithium-ion secondary batteries are used for portable information terminals such as mobile phones, smartphones, tablets, and laptop computers; game machines; portable music players; digital cameras; medical equipment; next-generation clean energy vehicles such as hybrid electric vehicles (HEVs), electric vehicles (EVs), and plug-in hybrid vehicles (PHEVs): electric-powered vehicles such as electric motorcycles and motor-assisted bicycles; and the like.

A secondary battery is affected by deterioration called cycle deterioration caused by repeated charge and discharge and deterioration called calendar deterioration that occurs as usage time of the secondary battery passes. As an index for quantifying the health state and the deterioration state of the secondary battery, SOH (State Of Health: also referred to as soundness) is known. The SOH of a brand new secondary battery is set to 100, and the SOH becomes a value smaller than 100 as the deterioration of the secondary battery progresses.

Furthermore, SOC (State Of Charge) which shows a charging state or a charging rate is also known as an index for quantifying the state of the secondary battery.

The SOH varies between secondary batteries even right after manufacture, decreases as the number of cycles increases, and is influenced by various parameters such as the voltage, charge and discharge current, temperature, and internal resistance of the battery. Thus, in the case where time has elapsed after a user starts to use a secondary battery, it is difficult to predict the SOH or SOC because various parameters change. In general, the lifetime of a secondary battery is set to a period until the full charge capacity, which is measured after the secondary battery is charged and discharged multiple times by a user, decreases to 20% of the initial full charge capacity, or a period until the full charge capacity deteriorates and deceases to 50% of the initial full charge capacity. Patent Document 1 discloses a battery state prediction system which predicts a capacity retention rate from an observation model for calculating the capacity retention rate of a secondary battery.

REFERENCE

Patent Document

[Patent Document 1] Japanese Published Patent Application No. 2013-19730

SUMMARY OF THE INVENTION

Problems to be Solved by the Invention

An object is to estimate the lifetime of a secondary battery by predicting its deterioration state even in an environment where temperature and a charging voltage change.

A user desires to predict and know the timing of replacement of the secondary battery. This is because the lifetimes given by the manufacturers of secondary batteries as the indication of the lifetimes of the secondary batteries are based on the cycles under certain conditions and the batteries have individual differences; therefore, accuracy is not yet satisfied. In particular, in the case where the battery lifetime, which influences the mileage, of a secondary battery which is an only power source for an electric-powered vehicle is predicted to be longer than the actual lifetime incorrectly, the sudden reach to the end of the battery lifetime and electric power shortage make it impossible for the electric-powered vehicle to move while moving to the destination.

Moreover, a battery unit called an assembled battery or battery pack in which a plurality of secondary batteries are connected to each other in series or in parallel is used in an electric-powered vehicle. In the case of using a plurality of secondary batteries, it is known that the deterioration gap among them is widened over time because their charge and discharge capacities do not deteriorate uniformly and the progress rate of deterioration differs between them. In the case where the deterioration gap among a plurality of secondary batteries is wide, there is a risk that the secondary batteries with little deterioration are overcharged when the secondary batteries with significant deterioration are charged fully, or there is a problem in that current flows from the secondary batteries with little deterioration to the secondary batteries with significant deterioration when the plurality of secondary batteries are connected to each other in series.

Another object is to predict the deterioration states of a plurality of secondary batteries.

Means for Solving the Problems

The invention disclosed in this specification is a lifetime estimation device of a secondary battery, including a measuring unit for measuring the capacity of the secondary battery in the full charging state, a temperature sensing unit for sensing the ambient temperature of the secondary battery, a storage unit for storing a table of a proportional coefficient corresponding to temperature in advance, and a microcomputer calculating a predicted deterioration line of the secondary battery with the use of a nonlinear regression equation approximated to a measured deterioration line obtained by the measuring unit.

Although a lot of parameters change with the usage conditions of a user, elapsed time, or the like with respect to the progress of deterioration of the secondary battery, the present inventors have found that the capacity of the secondary battery deteriorates mainly because of a temperature of a usage environment of the secondary battery and the sum of calendar deterioration and cycle deterioration, and built a relational expression which can minimize the number of parameters used for the deterioration prediction and obtain the optimal prediction results. Therefore, a capacity deterioration rate can be calculated using the relational expression. It is preferable that a variable table necessary for the relational expression, specifically, a deterioration factor $Kf$ of calendar deterioration and a deterioration factor $Kc$ of cycle deterioration, be prepared in advance and stored in a database or the like. The deterioration factor $Kf$ of calendar deterioration and the deterioration factor $Kc$ of cycle deterioration are proportional to a temperature, a voltage, and the like.

Regarding the temperature, a plurality of patterns of a temperature profile (outside temperature) at the time when the secondary battery is used are prepared. Furthermore, in accordance with the temperature profile, the graph of a predicted deterioration line of the secondary battery predicted using the temperature, the charging voltage, and the number of cycles as variables is obtained from the deterioration expression.

A high-accuracy lifetime estimation of the secondary battery is performed using the deterioration factor $Kf$ or the deterioration factor $Kc$ that are obtained by an experiment of a lithium-ion secondary battery (a calendar deterioration test or cycle deterioration measurement) conducted in advance. The calendar deterioration test of the secondary battery conducted in advance acquires the deterioration factor $Kf$ with the use of the temperature and the charging voltage as variables. Furthermore, the cycle deterioration measurement of the lithium-ion secondary battery conducted in advance acquires the deterioration factor $Kc$ with the use of the temperature and the charging voltage as variables.

It is known as a square root law that a capacity reduction rate of the secondary battery is proportional to the one-half power of the amount of flowing current of the secondary battery or the one-half power of the resting time of the secondary battery. The SOH that can also be referred to as the capacity retention rate can be expressed by the following formula.

$$\text{State of Health(SOH)} = 100 - Kc \times \sqrt{\text{Cyclenumber}}[\%] \quad \text{[Formula 1]}$$

Note that the capacity retention rate is a ratio of capacity at some point in time to the initial capacity that is multiplied by 100 and represented by percentage. There is a difference between the square root law described above and the cycle test results obtained by measurement (also referred to as a measured deterioration line), and a new nonlinear regression equation is approximated in order to make the difference small. The approximated nonlinear regression equation is shown below.

$$\text{State of Health(SOH)} = 100 - a \times \sqrt{\text{Cyclenumber}} - b \times (\text{Cycle number})^2 \quad \text{[Formula 2]}$$

(Note that $a$ and $b$ are proportional coefficients)

Two variables of a proportional coefficient a and a proportional coefficient b can be estimated as $Kc$ from the measured value of the measured deterioration line. This relational expression is the original relational expression and can also be referred to as a deterioration rate prediction expression. An expected deterioration line (also referred to as a predicted deterioration line) which shows the progress of deterioration of the secondary battery can be drawn on a graph with the capacity retention rate as the vertical axis and the number of cycles as the horizontal axis. Note that this relational expression is an example and depends on types of secondary batteries. Thus, this relational expression is optimal for the case where the type and size of a secondary battery are the same as those of the lithium-ion secondary battery measured in advance.

Virtual cycle performance is calculated using the relational expression and the proportional coefficients based on the measured value; thus, the lifetime can be estimated with high accuracy. Specifically, the predicted lifetime and the number of predicted lifetime cycles can be calculated.

Preparation of a large amount of data on the measured capacity retention rate makes it possible to obtain data similar to deterioration in the actual usage conditions of the secondary battery (the measured deterioration line). The actual usage conditions of the secondary battery depend on the intended use of the secondary battery (for business or household), a region where it is used (e.g., a cold region or a warm region), seasonal variation, or a user; therefore, it is impractical to compare the actual data with tens of thousands of data. Thus, machine-learning techniques such as an artificial neural network (hereinafter referred to as a neural network) are further used.

Another embodiment disclosed in this specification is a lifetime estimation device of a secondary battery, including a measuring unit for measuring the capacity of the secondary battery in the full charging state, a temperature sensing unit for sensing the ambient temperature of the secondary battery, a storage unit for storing a table of a proportional coefficient corresponding to temperature in advance, and a lifetime estimation portion performing a neural network operation of a predicted deterioration line of the secondary battery with the use of a nonlinear regression equation approximated to a measured deterioration line obtained by the measuring unit.

An embodiment is a lifetime estimation method of a secondary battery that has features that the number of charge and discharge cycles with respect to the capacity retention rate of the secondary battery is measured under some temperature conditions, a plurality of measured deterioration lines are generated, a deterioration factor is calculated from the plurality of measured deterioration lines, a first predicted deterioration line predicted from the temperature profile and the deterioration factor is generated, a neural network portion learns the first predicted deterioration line, and a second predicted deterioration line is calculated using the learned parameter.

In this specification, a neural network refers to a general model that is modeled on a biological neural network, determines the connection strength of neurons by learning, and has the capability of solving problems. The neural network includes an input layer, a middle layer (also referred to as a hidden layer), and an output layer.

In describing the neural network in this specification, to determine the connection strength of neurons (also referred to as a weight coefficient) from the existing information is sometimes referred to as "learning".

Moreover, in this specification, to draw a new conclusion from the neural network formed using the connection strength obtained by learning is sometimes referred to as "inference".

The neural network can have a configuration called a Long Short-Term Memory (LSTM). In LSTM, a hidden layer including a memory cell in an RNN stores a state, and analysis, such as prediction, about a longer period of time can be performed. In LSTM, an inference program is prepared by setting an adder (Add), a sigmoid function, tanh, Hadamard product, and the like besides a product-sum operation (MAC) as appropriate. A variety of programing languages such as Python, Go, Perl, Ruby, Prolog, Visual Basic, C C++, Swift, Java (registered trademark), and .NET can be used for the software programs that execute the inference program. The application may be formed using a framework such as Chainer (it can be used with Python), Caffe (it can be used with Python and C++), and TensorFlow (it can be used with C, C++, and Python). For example, the algorithm of LSTM is programmed with Python, and a CPU (Central Processor Unit) or a GPU (Graphics Processing Unit) is used. Furthermore, a chip in which a CPU and a GPU are integrated into one may be called an APU (Accelerated Processing Unit), and this APU chip can also be used. Moreover, an IC (also called an inference chip) incorporating an AI (Artificial Intelligence) system may also be used. The IC incorporating the AI system is sometimes called a circuit (microprocessor) performing a neural network operation.

For example, the deterioration of an actual vehicle battery can be predicted by transplanting models and parameters obtained by learning using the neural network to an in-vehicle microcomputer or microprocessor, or the like. Data for learning is obtained in advance using a secondary battery manufactured with the same manufacturing apparatus as that for the targeted secondary battery.

The microcomputer includes a plurality of input/output terminals, and at least a temperature sensing input terminal connected to an output terminal of a temperature sensor sensing the ambient temperature of the secondary battery is included.

The temperature is the ambient temperature of a battery cell. The ambient temperature data is obtained using a temperature sensing unit. As the temperature sensing unit, a thermistor, a resistance thermometer, a semiconductor temperature sensor, a thermocouple, a thermopile, or the like is used.

In LSTM, time-series data can be processed in real time. At this time, prediction takes the ambient temperature, voltage, and the like of a vehicle into consideration; thus, high-accuracy prediction should be performed. According to the embodiment of the invention disclosed in this specification, high-accuracy lifetime estimation can be achieved by models, which are obtained by learning using the neural network, and two or more and ten or less parameters, which are keys to lifetime estimation, even if data related to the lifetime is large in amount and complicated.

Not only lifetime estimation of the secondary battery, but also another processing using the lifetime estimation results may be performed; for example, a warning such as an alert can be given to a user, or charging conditions can be changed such that the deterioration is reduced.

Another embodiment disclosed in this specification is an abnormality detection method of a secondary battery, which measures the number of charge and discharge cycles with respect to the capacity retention rate of the secondary battery under some temperature conditions, generates a plurality of measured deterioration lines, calculates a deterioration factor from the plurality of measured deterioration lines, generates a predicted deterioration line predicted from the temperature profile and the deterioration factor, and gives a warning of abnormality to a user at the time when the predicted deterioration line greatly differs from the measured deterioration lines. For example, a user receives a warning of abnormality at the time when a gap between values of the predicted deterioration line and the measured deterioration lines is greater than or equal to 50%.

In the case where processing of lifetime estimation of the secondary battery is executed by software, a program or the like can be installed from a network, a storage medium, or a computer in which a program that constructs software is incorporated in hardware. A program stored in a computer-readable storage medium such as a CD-ROM (Compact Disk Read Only Memory) is installed, and the program for lifetime estimation of the secondary battery is executed. The processing by the program is not necessarily performed in order or sequentially, and may be performed in parallel, for example.

Furthermore, a lifetime estimation device of a secondary battery or a lifetime estimation method of a secondary battery can be used not only for a lithium-ion secondary battery, but also for a lead-acid battery, a sodium secondary battery, a nickel hydrogen battery, and the like when changed as appropriate. In a device including a replaceable secondary battery or battery pack, an embodiment of the lifetime estimation device of the secondary battery does not include the secondary battery; however, in the case of a device in which a dedicated secondary battery or battery pack is connected such that the battery is not replaceable, the embodiment of the lifetime estimation device of the secondary battery includes the secondary battery in some cases.

Effect of the Invention

Examination of the state of a secondary battery makes it possible to predict a usable period. The prediction results can be reflected, for example, the timing of replacement of the secondary battery can be decided.

A rapid deterioration of a secondary battery due to a large difference between a predicted deterioration line and an actual measured deterioration line can be regarded as abnormality of a secondary battery, so that abnormality of a battery can be detected.

MODE FOR CARRYING OUT THE INVENTION

Embodiments of the present invention will be described below in detail with reference to the drawings. Note that the present invention is not limited to the description below, and it is easily understood by those skilled in the art that modes and details of the present invention can be modified in various ways. In addition, the present invention should not be construed as being limited to the description in the embodiments given below.

Embodiment 1

Figure 1A:
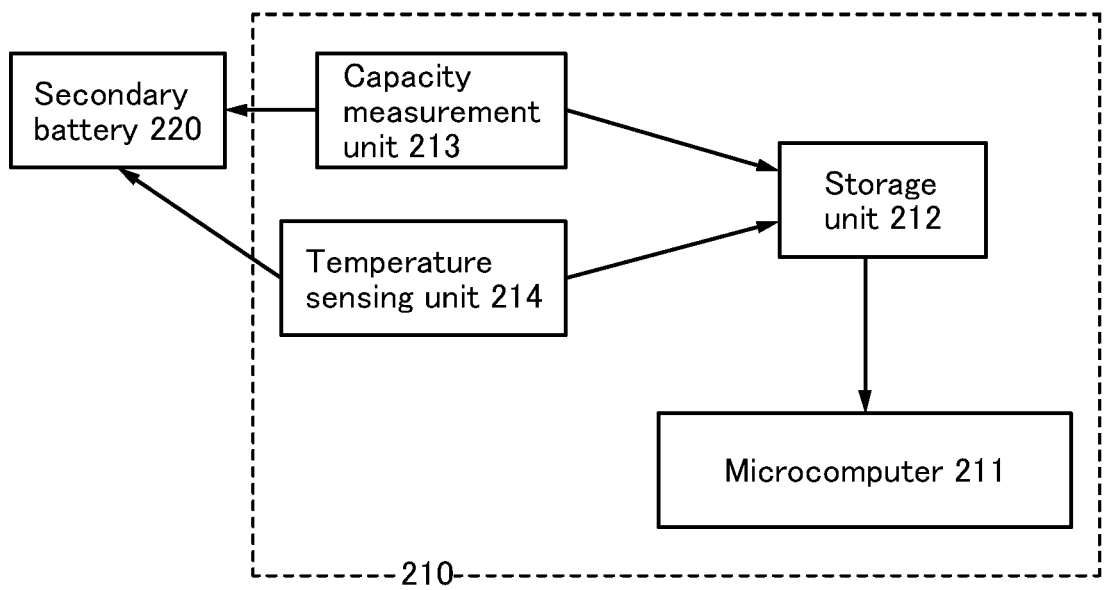
FIG. 1 Block diagrams illustrating one embodiment of the present invention.

FIG. 1(A) is an example of a block diagram illustrating a hardware configuration example of a lifetime estimation device constructing a lifetime estimation system of a secondary battery. The lifetime estimation system of the secondary battery includes at least the secondary battery, a charge and discharge circuit, and a lifetime estimation device 210.

A hardware configuration of the lifetime estimation device 210 includes at least a CPU. Various known memories can be used as a storage unit 212, and the storage unit 212 refers to a database when storing a large amount of data.

A microcomputer 211 shown in FIG. 1(A) can also be called a microprocessor. In FIG. 1(A), the storage unit 212 and the microcomputer 211 are shown separately, but the microcomputer 211 also serves as part of the storage unit in some cases because the microcomputer 211 includes the CPU and the CPU may include a register, a memory, a cache memory, and the like.

With a communication portion, part of the storage unit is connected through a network.

Some devices (an electronic device, a vehicle, and the like) may include a plurality of secondary batteries 220. In the case where the plurality of secondary batteries 220 are provided, the secondary battery 220 illustrated in the drawing indicates a secondary battery which is to estimate the lifetime among the plurality of secondary batteries 220 provided in the device.

A capacity measurement unit 213 is a unit measuring the capacity of the secondary battery 220, or a unit measuring the cycle performance of the secondary battery. For example, the capacity is measured by an impedance track method, a cell modeling method, or a coulomb counter method. Specifically, the capacity measurement unit obtains data for plotting measurement points on a graph with SOH as a vertical axis and the number of cycles as a horizontal axis.

A temperature sensing unit 214 is a sensor measuring the ambient temperature of the secondary battery. The ambient temperature data is obtained by the temperature sensing unit 214.

Described in this embodiment is an example of procedures of the lifetime estimation with the lifetime estimation device 210 in the case where the secondary battery 220 estimating the lifetime is a lithium-ion secondary battery.

First, a cycle test is performed on the secondary battery in advance with the use of the capacity measurement unit in order that a relational expression for the lifetime estimation can be searched and determined.

Figure 2A:
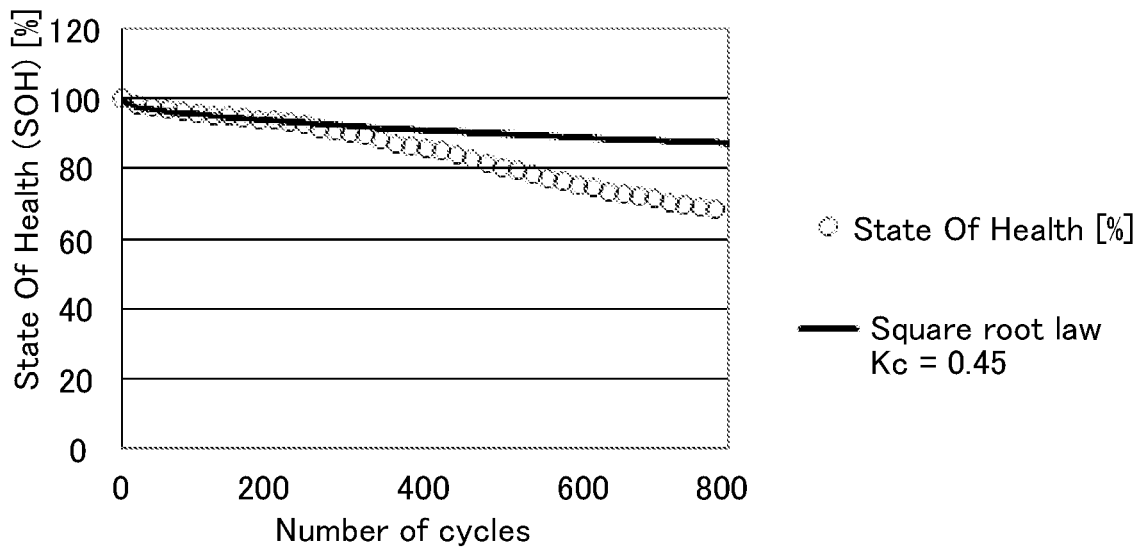
FIG. 2 Graphs of measured data showing one embodiment of the present invention.

FIG. 2(A) shows a graph of the test results. The measurement conditions of SOH are as follows: the charging voltage is 4.0 V; the ambient temperature is 45° C.; the charging rate is 0.5 C; and the discharging rate is 1.0 C. Furthermore, FIG. 2(A) also shows the data of the square root law with a deterioration factor Kc of 0.45, revealing difficulty in using the square root law as it is for the relational expression for deterioration prediction because of a wide gap.

The present inventors have searched a relational expression on the basis of measured data of the lithium-ion secondary battery used here and have determined another nonlinear regression equation.

Figure 2B:
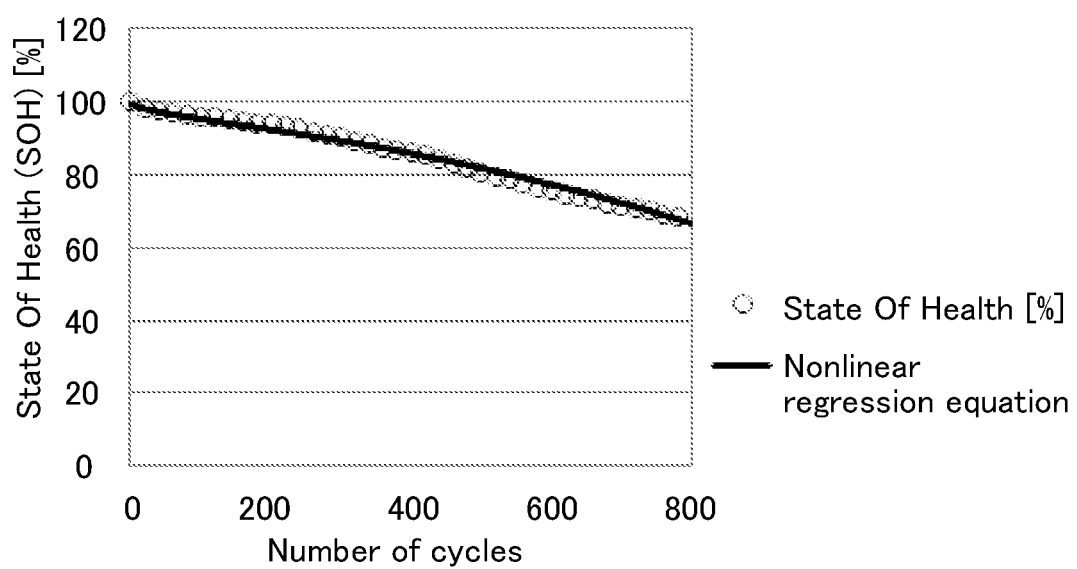

In addition. FIG. 2(B) shows a predicted deterioration line based on the nonlinear regression equation instead of the square root law. FIG. 2(B) reveals that the nonlinear regression equation can be approximated to the measured data.

The measured data in FIG. 2 is obtained under one measurement condition (an ambient temperature of 45° C. and a charging voltage of 4.0 V); therefore, the measured data at 25° C. with a charging voltage of 4.1 V, a charging voltage of 4.2 V, and a charging voltage of 4.3 V are additionally obtained to increase the amount of data, and a table of the proportional coefficient a shown below is created from the results.

TABLE 1

|        | 4.0 V | 4.1 V | 4.2 V | 4.3 V |
|--------|-------|-------|-------|-------|
| 25° C. | 0.631 | 0.646 | 0.770 | 0.966 |
| 45° C. | 0.462 | 0.598 | 0.578 | 0.966 |

A table of the proportional coefficient b is also shown below.

TABLE 2

|        | 4.0 V    | 4.1 V    | 4.2 V    | 4.3 V |
|--------|----------|----------|----------|-------|
| 25° C. | 0        | 1.64E−05 | 4.53E−05 | 0     |
| 45° C. | 3.18E−05 | 2.42E−05 | 7.39E−05 | 0     |

Figure 3A:
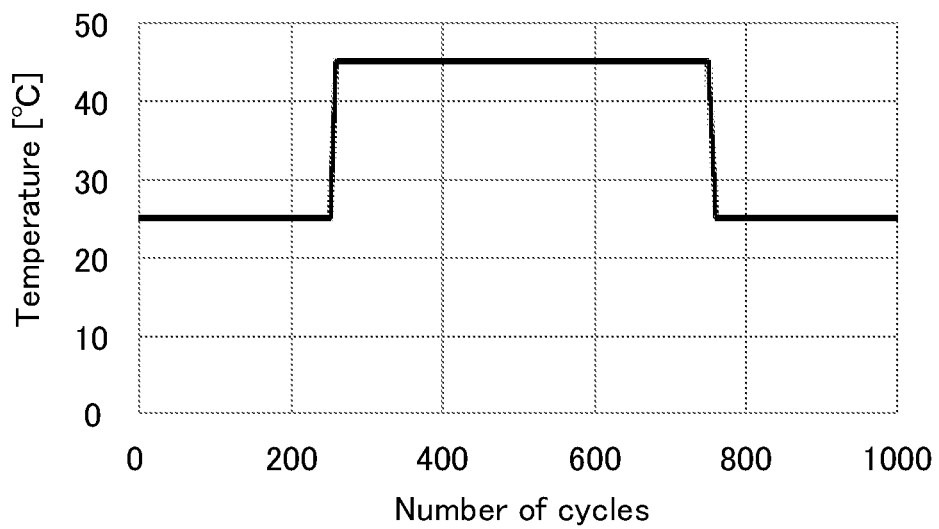
FIG. 3 Graphs showing virtual data and prediction.
Figure 3B:
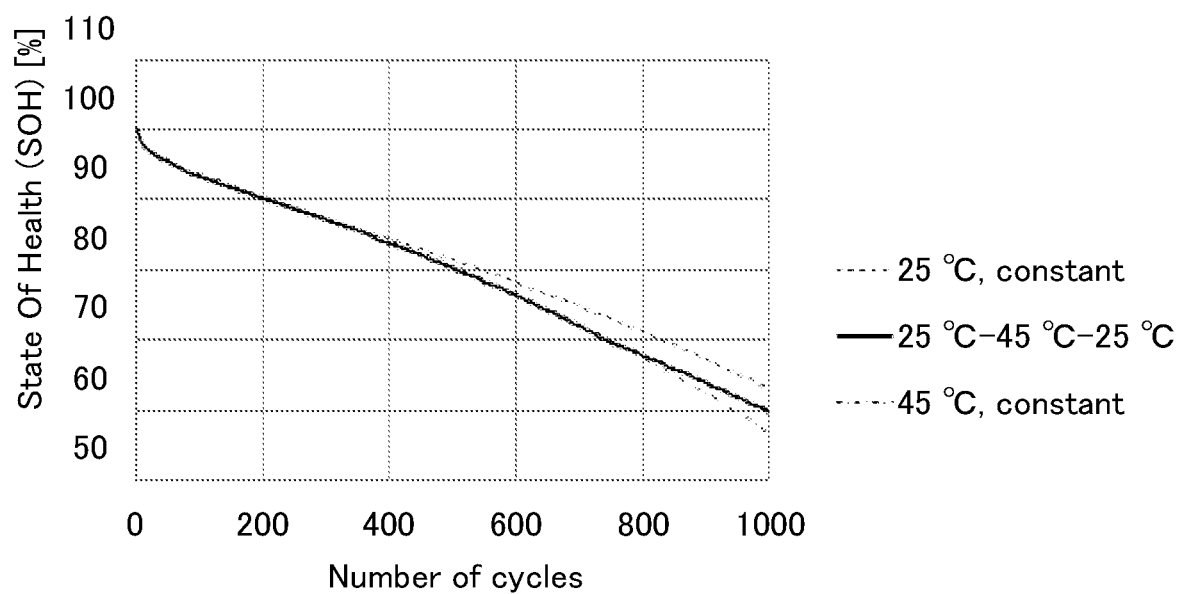

Both the proportional coefficient a and the proportional coefficient b are the deterioration factors Kc of the cycle deterioration. The deterioration degree of SOH due to the number of cycles, a temperature, and a voltage can be estimated using a coefficient of the nonlinear regression equation. Thus, the deterioration of SOH in the ambient temperature profile of the secondary battery shown in FIG. 3(A) is estimated as in FIG. 3(B), for example. FIG. 3(A) is set as virtual data, and the results of the predicted deterioration lines are shown in FIG. 3(B).

In this embodiment, data of 45° C. and 25° C. are used, but a user probably uses the secondary battery at various ambient temperatures. Thus, in the case where a more accurate predicted deterioration line is needed, additional cycle tests are preferably performed under varying temperature conditions to prepare a number of coefficient tables in the storage unit. A coefficient table may be prepared by obtaining performance at every 5° C. of the ambient temperature, for example.

The deterioration factor Kf of the calendar deterioration is not considered because the secondary battery used here is little influenced by the calendar deterioration. In the case of a secondary battery significantly influenced by the calendar deterioration, or in the case where the lifetime is predicted in terms of long-term reliability, the deterioration factor Kf of the calendar deterioration is calculated on the basis of the results of the calendar deterioration test in order that the predicted deterioration line can be obtained. FIG. 1 shows an example in which the deterioration based on the measured data is promoted as compared with that based on the square root law; however, this embodiment is not particularly limited thereto, and the deterioration based on the square root law may be promoted as compared with that based on the measured data when another lithium-ion secondary battery is used. Also in that case, an optimal relational expression approximated to the measured data is searched and determined.

Embodiment 2

Figure 1B:
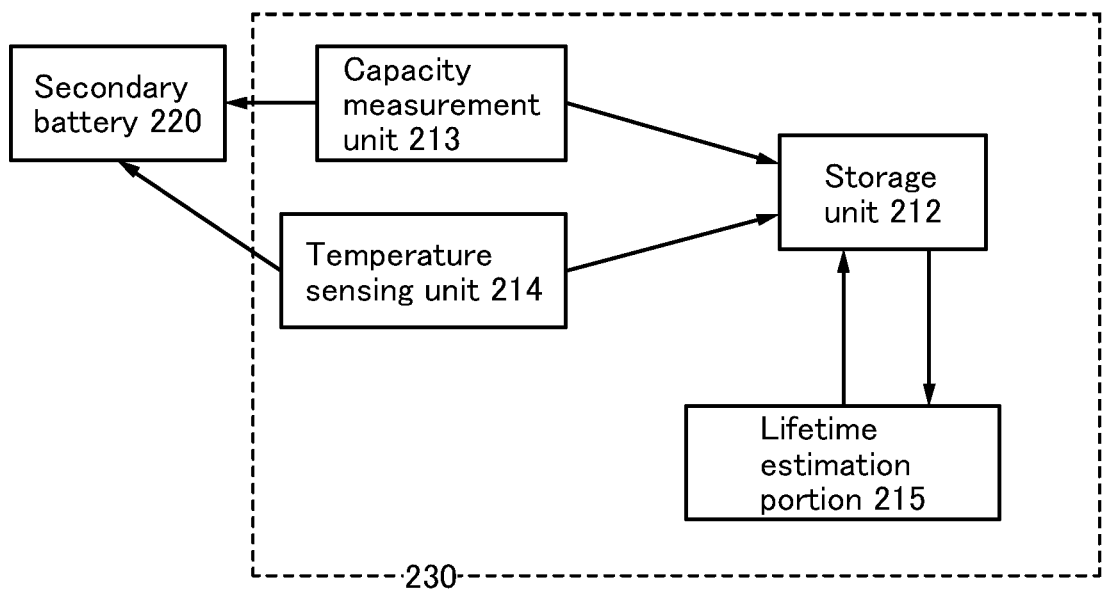

FIG. 1(B) is a block diagram illustrating a hardware configuration example of a lifetime estimation device 230 constructing a lifetime estimation system with the use of a neural network. Note that an example in this embodiment is partly different from that in Embodiment 1, and the same reference numerals are used for the same parts.

A hardware configuration of the lifetime estimation device 230 includes at least a CPU. Various known memories can be used as the storage unit 212, and the storage unit 212 refers to a database when storing a large amount of data.

With a communication portion, part of the storage unit is connected through a network.

Some devices (an electronic device, a vehicle, and the like) may include the plurality of secondary batteries 220. In that case, the secondary battery 220 illustrated in the drawing indicates a secondary battery which is to estimate the lifetime among the plurality of secondary batteries 220 provided in the device.

The capacity measurement unit 213 is a unit measuring the capacity of the secondary battery, or a unit measuring the cycle performance of the secondary battery. Specifically, the capacity measurement unit obtains data for plotting measurement points on a graph with SOH as a vertical axis and the number of cycles as a horizontal axis.

The temperature sensing unit 214 is a sensor measuring the ambient temperature of the secondary battery. The ambient temperature data is obtained by the temperature sensing unit.

A lifetime estimation portion 215 can learn the measured data and generate an accurate predicted deterioration line in consideration of climate change and a charge and discharge depth. In addition, the lifetime estimation portion not only learns the measured data but also generates and learns virtual data for learning. Specifically, generation of tens of thousands of deterioration curves and LSTM learning are performed with a high-speed computer (server). Since time-series data can be processed in real time in LSTM, the deterioration after hundreds of cycles in the future can be predicted from the deterioration degree after tens of cycles in the past. At this time, the prediction takes the ambient temperature, voltage, and the like of a vehicle into consideration; thus, high-accuracy prediction should be performed.

In the case where any of the methods described in Embodiment 1 is used, it is difficult to compare the actual deterioration curve with tens of thousands of deterioration curves one by one because the battery is actually used under various conditions. In this embodiment, data similar to the actual deterioration can be obtained by a neural network that has performed learning.

Furthermore, another parameter may be added; for example, usage history data such as time at which charging is performed, charging period, time at which discharging is performed, and discharging period of the secondary battery is stored in the storage unit, and the data may be learned by the lifetime estimation portion 215.

An example of neural network processing performed in the lifetime estimation portion 215 is shown in FIG. 4.

Figure 4A:
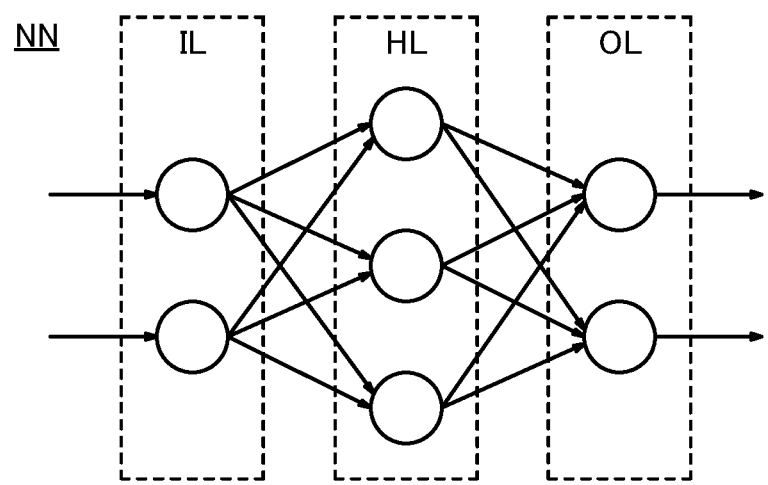
FIG. 4 Diagrams showing a configuration example of neural network processing.

As illustrated in FIG. 4(A), neural network processing NN can be composed of an input layer IL, an output layer OL, and a middle layer (hidden layer) HL. The input layer IL, the output layer OL, and the middle layer HL each include one or more neurons (units). Note that the middle layer HL may be composed of one layer or two or more layers. Neural network processing using two or more middle layers HL can also be referred to as DNN (deep neural network), and learning using deep neural network processing can also be referred to as deep learning.

Input data is input to each neuron of the input layer IL, output signals of neurons in the previous layer or the subsequent layer are input to each neuron of the middle layer HL, and output signals of neurons in the previous layer are input to each neuron of the output layer OL. Note that each neuron may be connected to all the neurons in the previous and subsequent layers (full connection), or may be connected to some of the neurons.

Figure 4B:
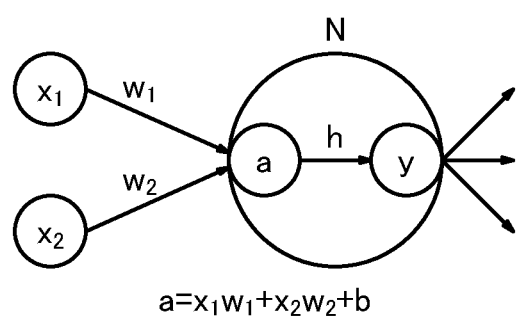

FIG. 4(B) shows an example of an operation with the neurons. Here, a neuron N and two neurons in the previous layer which output signals to the neuron N are shown. An output $x_1$ of the neuron in the previous layer and an output $x_2$ of the neuron in the previous layer are input to the neuron N. Then, in the neuron N, a total sum $x_1w_1+x_2w_2$ of the product of the output $x_1$ and a weight $w_1$ ($x_1w_1$) and the product of the output $x_2$ and a weight $w_2$ ($x_2w_2$) is calculated, and then a bias b is added as necessary, so that a value $a=x_1w_1+x_2w_2+b$ is obtained. Then, the value a is converted with an activation function h, and an output signal $y=h(a)$ is output from the neuron N.

In this manner, the operation with the neurons includes the operation that sums the products of the input data and the weights, that is, a product-sum operation. This product-sum operation can be performed by a product-sum operation circuit MAC including a current supply circuit CM, an offset absorption circuit OFS, and a cell array CA. In addition, signal conversion with the activation function h can be performed by a hierarchical output circuit OU. In other words, the operation of the middle layer HL or the output layer OL can be performed by an operation circuit AC.

The cell array CA included in the product-sum operation circuit is composed of a plurality of memory cells MU arranged in a matrix.

The memory cells MU each have a function of storing first data. The first data is data corresponding to the weight between the neurons of the neural network processing. In addition, the memory cells MU each have a function of multiplying the first data by second data that is input from the outside of the cell array CA. That is, the memory cells MU have a function of a memory circuit and a function of a multiplier circuit.

Note that in the case where the first data is analog data, the memory cells MU have a function of an analog memory. Alternatively, in the case where the first data is multilevel data, the memory cells MU have a function of a multilevel memory.

The multiplication results in the memory cells MU in the same column are summed up. Thus, the product-sum operation of the first data and the second data is performed. Then, the results of the operation in the cell array CA are output to the hierarchical output circuit OU as third data.

The hierarchical output circuit OU has a function of converting the third data output from the cell array CA in accordance with a predetermined activation function. An analog signal or a multilevel digital signal output from the hierarchical output circuit OU corresponds to the output data of the middle layer or the output layer in the neural network processing NN.

As the activation function, a sigmoid function, a tanh function, a softmax function, a ReLU function, a threshold function, or the like can be used, for example. The signal converted by the hierarchical output circuit OU is output as analog data or multilevel digital data (data $D_{analog}$).

In this manner, one of the operations of the middle layer HL and the output layer OL in the neural network processing NN can be performed by one operation circuit AC. Note that the product-sum operation circuit MAC and the hierarchical output circuit OU included in the operation circuit AC[k] (k is an integer greater than or equal to 1 and less than or equal to N) are denoted by the product-sum operation circuit MAC[k] and the hierarchical output circuit OU[k], respectively. The analog data or the multilevel digital data output from the operation circuit AC[k] is denoted by data $D_{analog}[k]$.

Analog data or multilevel digital data output from a first operation circuit AC is supplied to a second operation circuit AC as the second data Men, the second operation circuit AC performs an operation using the first data stored in the memory cells MU and the second data input from the first operation circuit AC. Thus, operation of neural network processing composed of a plurality of layers can be performed.

Specifically, an abnormality detection system evaluates, analyzes, or learns, for example, various obtained data using machine learning or artificial intelligence, estimates the predicted deterioration degree, and notifies a user of abnormality if the abnormality is detected.

Moreover, comparison between the obtained predicted deterioration line and measured deterioration line may allow a user to choose whether a proposal for inhibiting the deterioration, e.g., a proposal for reducing a charge and discharge voltage of the secondary battery, is implemented or not. In the case of an assembled battery, the lifetime can be extended while the capacity is kept by changing the charge and discharge voltage with the difference in the deterioration between batteries. In the case where a gap between one battery and the other batteries among a plurality of batteries is wide, the battery is regarded as abnormal; thus, abnormality of the battery can be detected.

Embodiment 3

In this embodiment, an example of an IC chip used for the microcomputer 211 described in Embodiment 1 or the lifetime estimation portion 215 described in Embodiment 2 will be described.

<Fabrication Method Example of Electronic Component>

Figure 5:
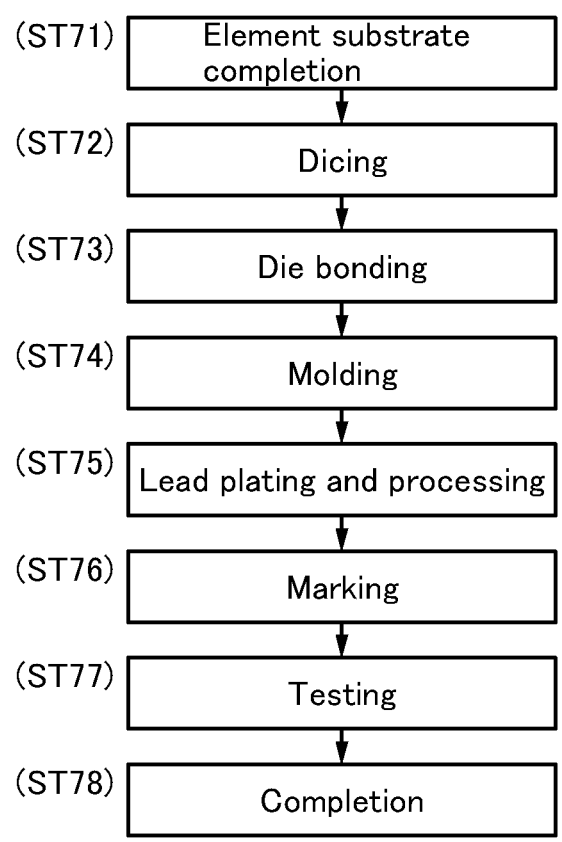
FIG. 5 A flow chart showing an example of a method for manufacturing an electronic component.

FIG. 5 is a flow chart showing an example of a method for fabricating an electronic component. The electronic component is also referred to as a semiconductor package or an IC package. The electronic component has a plurality of standards and names corresponding to a terminal extraction direction and a terminal shape. Thus, an example of the electronic component is described in this embodiment.

A semiconductor device including a transistor is completed by integrating a plurality of detachable components on a printed board through an assembly process (post-process). The post-process can be completed through steps shown in FIG. 5. Specifically, after an element substrate obtained in the pre-process is completed (Step ST71), a back surface of the substrate is ground. The element substrate is thinned at this stage to reduce warpage or the like of the element substrate caused in the pre-process and to reduce the size of the component. Then, a dicing step of dividing the element substrate into a plurality of chips is performed (Step ST72).

Figure 6A:
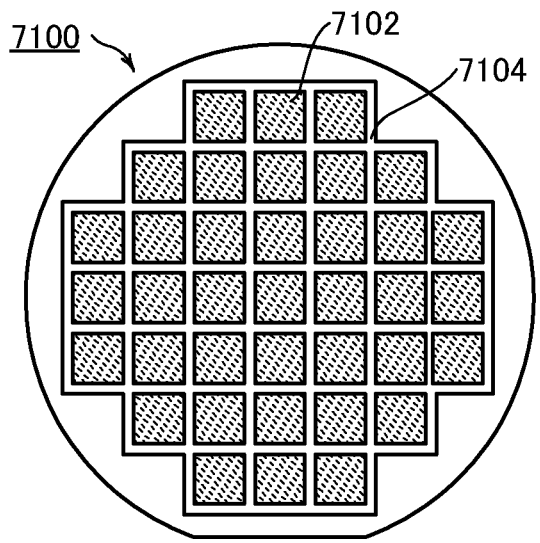
FIG. 6 A top view of a semiconductor wafer, an enlarged view of the top view, a schematic view illustrating a configuration example of a chip, and schematic perspective views and a cross-sectional view illustrating a configuration example of an electronic component.
Figure 6B:
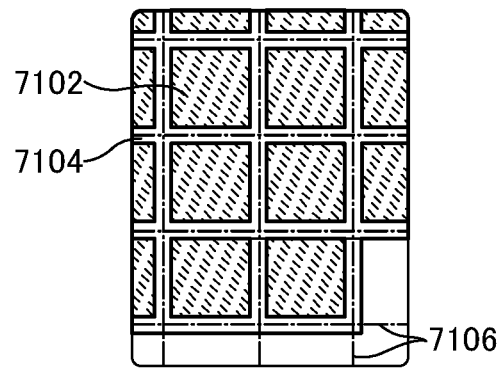

FIG. 6(A) is a top view of a semiconductor wafer 7100 before the dicing step is performed. FIG. 6(B) is a partial enlarged view of FIG. 6(A). A plurality of circuit regions 7102 are provided on the semiconductor wafer 7100. A semiconductor device (e.g., a holding circuit, a memory device, an imaging device, or an MCU) is provided on each of the circuit regions 7102.

Figure 6C:
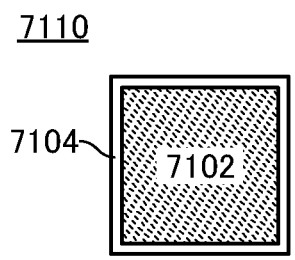

The plurality of circuit regions 7102 are each surrounded by a separation region 7104. Separation lines (also referred to as "dicing lines") 7106 are set at positions overlapping with the separation region 7104. In the dicing step (Step ST72), the semiconductor wafer 7100 is cut along the separation lines 7106, whereby chips 7110 including the circuit regions 7102 are cut out from the semiconductor wafer 7100. FIG. 6(C) is an enlarged view of the chip 7110.

A conductive layer or a semiconductor layer may be provided in the separation region 7104. Providing a conductive layer or a semiconductor layer in the separation region 7104 relieves ESD that might be caused in the dicing step, preventing a decrease in the yield due to the dicing step. A dicing step is generally performed while pure water whose specific resistance is decreased by dissolution of a carbonic acid gas or the like is supplied to a cut portion, in order to cool down a substrate, remove swarf, and prevent electrification, for example. Providing a conductive layer or a semiconductor layer in the separation region 7104 allows a reduction in the usage of the pure water. Therefore, the manufacturing cost of semiconductor devices can be reduced. Furthermore, productivity of semiconductor devices can be increased.

After Step ST72 is performed, the divided chips are separately picked up in a die bonding step (Step ST73). In the die bonding step, for example, the chip is mounted on and bonded to a lead frame. As a method for bonding the chip to the lead frame, a method suitable for products may be selected. The bonding may be performed, for example, with a resin or a tape. In a wire bonding step, a lead of the lead frame and an electrode on the chip can be electrically connected to each other with a metal fine line (wire). A silver line or a gold line can be used as the metal fine line. The wire bonding may be either ball bonding or wedge bonding.

Furthermore, in the die bonding step, the chip may be mounted on and bonded to an interposer. A silicon interposer can be used as the interposer, for example. The electrode of the chip and a wiring of the silicon interposer are electrically and mechanically connected to each other with a bump, for example. As the electrode of the chip, a through-substrate via can be used.

A die-bonded chip is subjected to a molding step of sealing the chip with an epoxy resin or the like (Step ST74). The molding step is performed, whereby the inside of the electronic component is filled with a resin, so that damage to an embedded circuit portion and wire by external mechanical force can be reduced, and in addition, deterioration of performance due to moisture or dust can be reduced. The lead of the lead frame is subjected to a plating process, after which the lead is cut and processed (Step ST75). With the plating process, corrosion of the lead can be prevented, and soldering for mounting the electronic component on a printed board in a later step can be performed with higher reliability. A printing process (marking) is performed on a surface of the package (Step ST76). After a testing step (Step ST77), the electronic component is completed (Step ST78). Incorporating the lifetime estimation device described in the above embodiment can provide a small-sized low-power electronic component.

Figure 6D:
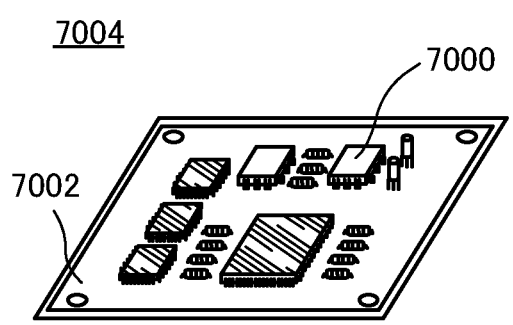
Figure 6E:
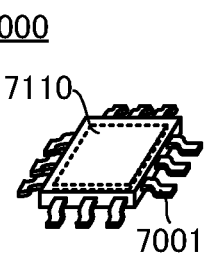

As shown in the example in FIG. 6(D) the electronic component 7000 is mounted on a printed board 7002, for example. A plurality of electronic components 7000 which are combined and electrically connected to each other over the printed board 7002 can be mounted on an electronic device. A completed circuit board 7004 is provided in an electronic device or the like. FIG. 6(E) is a schematic perspective view of the electronic component 7000 used in FIG. 6(D). FIG. 6(E) illustrates a schematic perspective view of a QFP (Quad Flat Package) as an example of the electronic component. The electronic component 7000 illustrated in FIG. 6(E) includes a lead 7001 and the chip 7110.

Figure 6F:
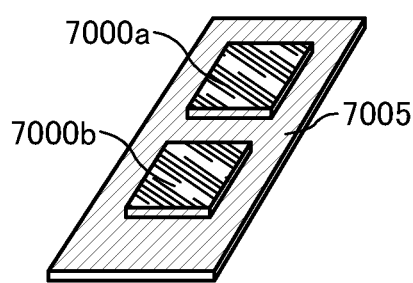

Furthermore, the electronic component may be mounted on a silicon interposer. FIG. 6(F) is a schematic perspective view of the case where an electronic component 7000a and an electronic component 7000b are mounted on a silicon interposer 7005.

Figure 6G:
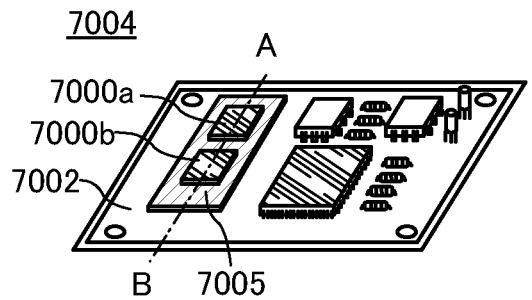
Figure 6H:
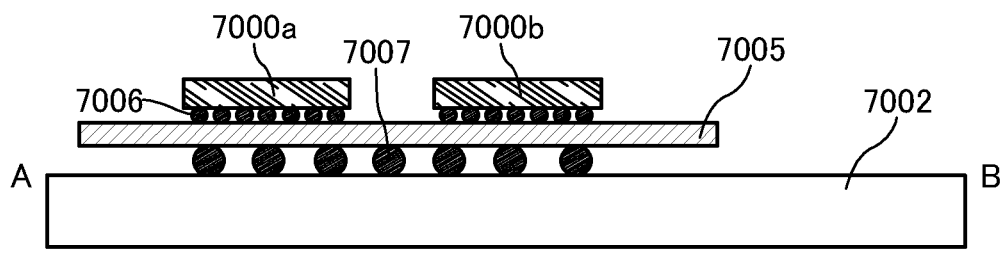

In addition, the electronic components mounted on the silicon interposer may be mounted on a printed board. FIG. 6(G) is a schematic perspective view of the circuit board 7004 including the printed board 7002 provided with the silicon interposer 7005 on which the electronic component 7000a and the electronic component 7000b are mounted. FIG. 6(H) is a cross-sectional view taken along the dashed-dotted line A-B illustrated in FIG. 6(G). The electronic component 7000a and the electronic component 7000b are placed over the silicon interposer 7005. The silicon interposer 7005 and the electronic components such as the electronic component 7000a are electrically and mechanically connected to each other via bumps 7006 as illustrated in FIG. 6(H), for example. Furthermore, as illustrated in FIG. 6(H), the silicon interposer 7005 is electrically and mechanically connected onto the printed board 7002 via bumps 7007, for example.

Mounting the electronic component 7000 achieves a reduction in the power consumption of the electronic device. Alternatively, the electronic device can easily have a smaller size.

The electronic component 7000 can be used as an electronic component (IC chip) of electronic devices in a wide range of fields, such as digital signal processing, software-defined radio systems, avionics (electronic devices related to aviation, such as communication systems, navigation systems, autopilot systems, and flight management systems). ASIC prototyping, medical image processing, voice recognition, encryption, bioinformatics, emulators for mechanical systems, and radio telescopes in radio astronomy. Examples of such an electronic device include cameras (e.g., video cameras and digital still cameras), display devices, personal computers (PC), mobile phones, game machines including portable game machines, portable information terminals (e.g., smartphones and tablet information terminals), e-book readers, wearable information terminals (e.g., watch-type information terminals, head-mounted information terminals, goggle-type information terminals, glasses-type information terminals, armband-type information terminals, bracelet-type information terminals, and necklace-type information terminals), navigation systems, audio reproducing devices (e.g., car audio players and digital audio players), copiers, facsimiles, printers, multifunction printers, automated teller machines (ATM), vending machines, and consumer electronics.

<Example of Electronic Component>

A memory device can be used as the electronic component 7000, for example. An SRAM (Static Random Access Memory) or a DRAM (Dynamic Random Access Memory) can be used as the memory device, for example. In addition, a NOSRAM (registered trademark), a DOSRAM (registered trademark), and the like using an OS transistor can be used as the memory device. The details of an OS transistor, a NOSRAM, and a DOSRAM will be described later.

As the electronic component 7000, a CPU (Central Processing Unit), a GPU (Graphic Processing Unit), an integrated circuit including a product-sum operation circuit, an FPGA (Field Programmable Gate Array), and the like can be used. Furthermore, a chip in which a CPU and a GPU are integrated into one is called an APU (Accelerated Processing Unit), and this APU chip can also be used.

The use of an OS transistor for the electronic component 7000 can reduce the power consumption of the electronic component 7000. Unlike a silicon transistor using a silicon substrate, an OS transistor can be formed by a film formation process such as a sputtering method or a plasma CVD method and thus transistors can be stacked, leading to high integration of the electronic component 7000.

<OS Transistor>

An OS transistor will be described below.

A channel formation region of an OS transistor preferably includes a metal oxide. The metal oxide included in the channel formation region preferably contains indium (In). When the metal oxide included in the channel formation region is a metal oxide containing indium, the carrier mobility (electron mobility) of the OS transistor increases. The metal oxide included in the channel formation region is preferably an oxide semiconductor containing an element M. The element M is preferably aluminum (Al), gallium (Ga), tin (Sn), or the like. Other elements that can be used as the element M are boron (B), silicon (Si), titanium (Ti), iron (Fe), nickel (Ni), germanium (Ge), yttrium (Y), zirconium (Zr), molybdenum (Mo), lanthanum (La), cerium (Ce), neodymium (Nd), hafnium (H), tantalum (Ta), tungsten (W), and the like. Note that a plurality of the above elements may be used in combination as the element M in some cases. The element M is an element having high bonding energy with oxygen, for example. The element M is an element having higher bonding energy with oxygen than indium, for example. The metal oxide included in the channel formation region is preferably a metal oxide containing zinc (Zn). The metal oxide containing zinc is easily crystallized in some cases.

The metal oxide included in the channel formation region is not limited to a metal oxide containing indium. The metal oxide may be a metal oxide containing zinc, a metal oxide containing gallium, a metal oxide containing tin, or the like that does not contain indium, e.g., zinc tin oxide or gallium tin oxide.

A NOSRAM and a DOSRAM will be described below.

<NOSRAM>

A NOSRAM is a gain cell DRAM in which a write transistor of a memory cell is an OS transistor. A NOSRAM is an abbreviation for Nonvolatile Oxide Semiconductor RAM.

Figure 7A:
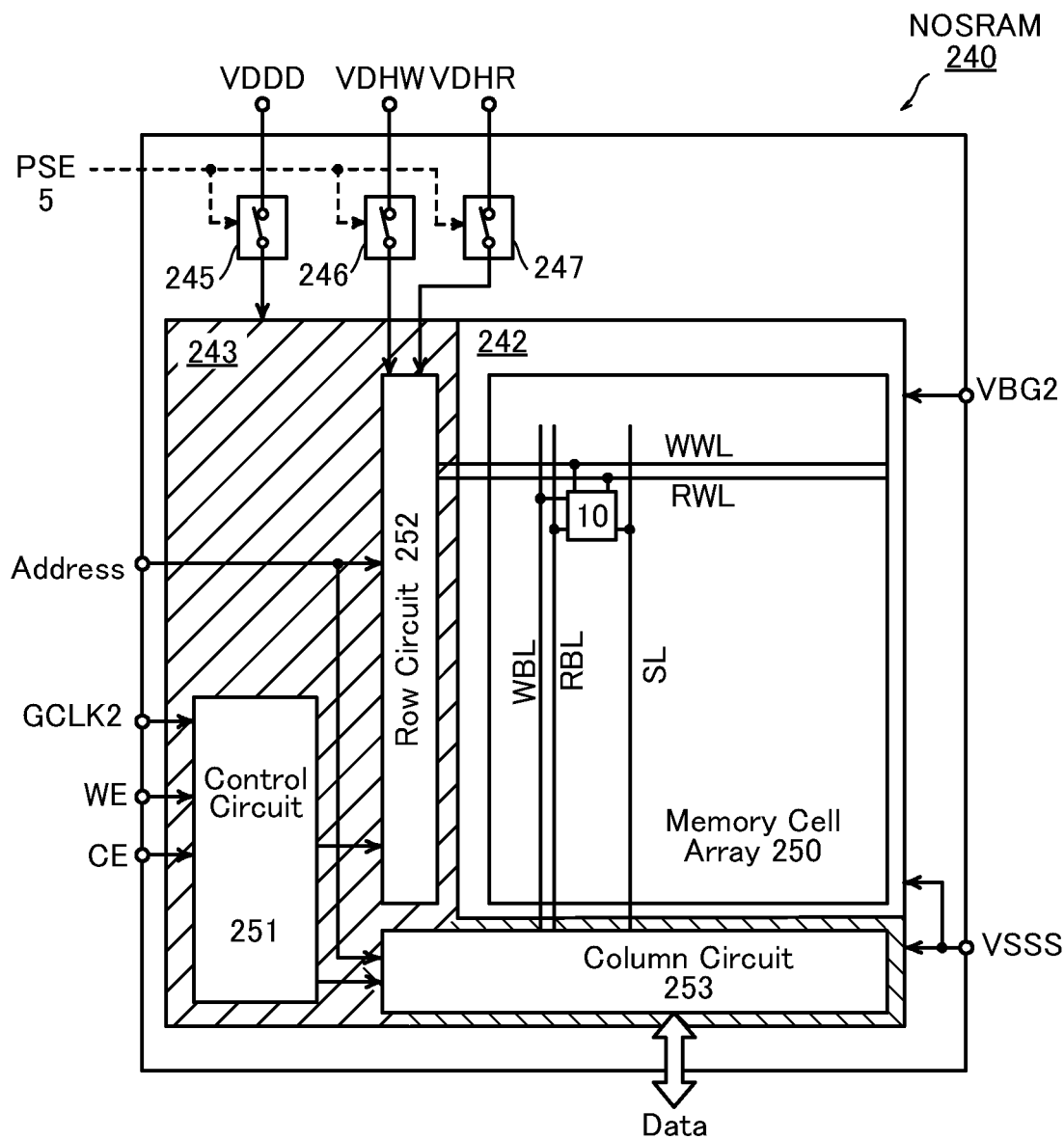
FIG. 7A: A functional block diagram illustrating a configuration example of a NOSRAM. B: A circuit diagram illustrating a configuration example of a memory cell.

A configuration example of a NOSRAM is described below. FIG. 7(A) is a block diagram illustrating a configuration example of a NOSRAM. A NOSRAM 240 includes power domains 242 and 243 and power switches 245 to 247. A memory cell array 250 is provided in the power domain 242, and a peripheral circuit of the memory cell array 250 is provided in the power domain 243. The peripheral circuit includes a control circuit 251, a row circuit 252, and a column circuit 253.

Voltages VDDD, VSSS, VDHW, VDHR, and VBG2, a clock signal GCLK2, an address signal (Address), and signals CE, WE, and PSE5 are input to the NOSRAM 240 from the outside. The signals CE and WE are a chip enable signal and a write enable signal, respectively. The signal PSE5 controls the on/off of the power switches 245 to 247. The power switches 245 to 247 control the input of the voltages VDDD, VDHW, and VDHR, respectively to the power domain 243.

Note that the voltages, signals, and the like input to the NOSRAM 240 are appropriately selected in accordance with the circuit configuration and operation method of the NOSRAM 240. For example, the NOSRAM 240 may be provided with a power domain which is not power gated, and a power gating control circuit that generates the signal PSE5 may be provided.

The memory cell array 250 includes a memory cell 10, a write word line WWL, a readout word line RWL, a write bit line WBL, a readout bit line RBL, and a source line SL.

Figure 7B:
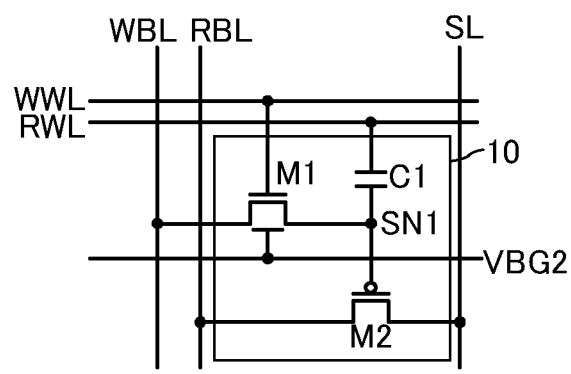

As illustrated in FIG. 7(B), the memory cell 10 is a 2T1C (two transistors and one capacitor) gain cell, which includes anode SN1, transistors M1 and M2, and a capacitor C1. The transistor M1 is a write transistor, which is an OS transistor having a back gate. The back gate of the transistor M1 is electrically connected to a wiring BGL2 for supplying the voltage VBG2. The transistor M2 is a readout transistor, which is a p-channel Si transistor. The capacitor C1 is a storage capacitor for retaining the voltage of the node SN1.

The voltages VDDD and VSSS are voltages representing data "1" and "0", respectively. Note that high-level voltages of the write word lines WWL and RWL are VDHW and VHDR, respectively.

Figure 8A:
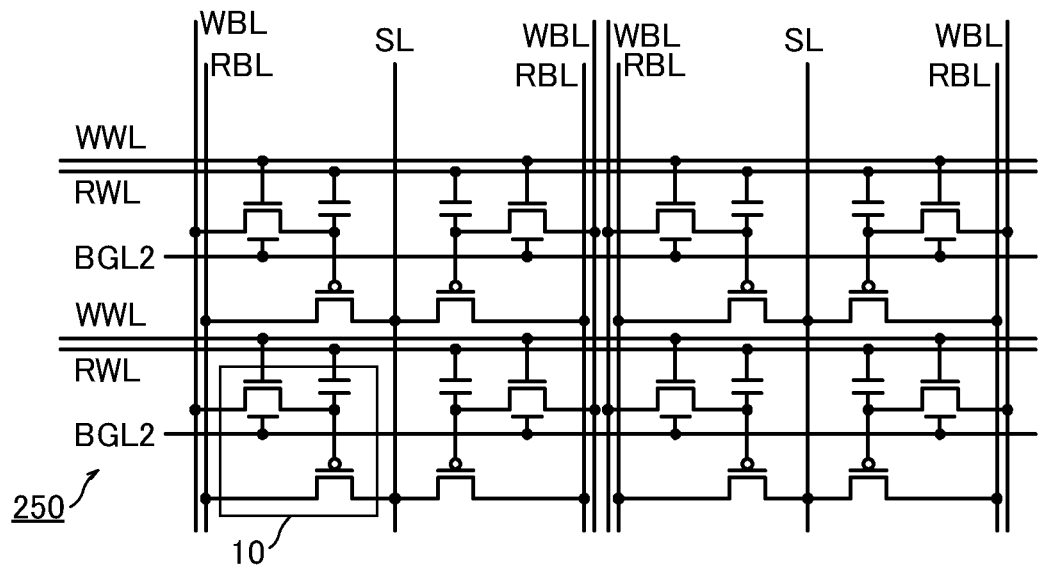
FIG. 8A: A circuit diagram illustrating a configuration example of a memory cell array. B, C: Circuit diagrams each illustrating a configuration example of a memory cell.

FIG. 8(A) illustrates a configuration example of the memory cell array 250. In the memory cell array 250 illustrated in FIG. 8(A), one source line is provided for two adjacent rows.

The memory cell 10 does not have a limitation on the number of rewriting times in principle, can perform data rewriting with low energy, and does not consume power in retaining data. Since the transistor M1 is an OS transistor with an extremely low off-state current, the memory cell 10 can retain data for a long time. Therefore, the storage unit 212 including the NOSRAM 240 can be a nonvolatile memory device with low power consumption.

Figure 8B:
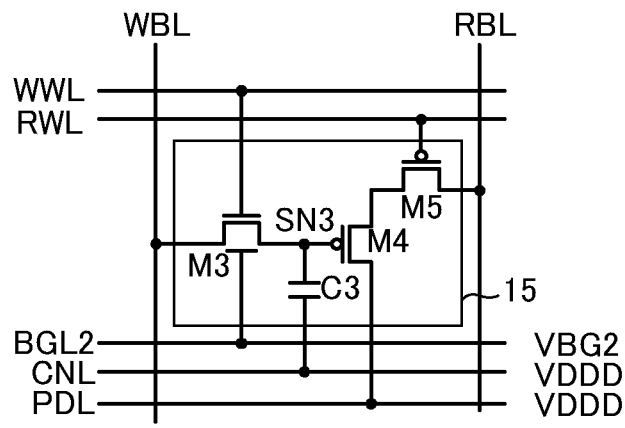
Figure 8C:
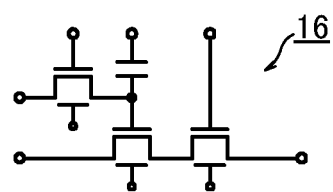

The circuit configuration of the memory cell 10 is not limited to the circuit configuration in FIG. 7(B). For example, the readout transistor M2 may be an OS transistor having a back gate or an n-channel Si transistor. Alternatively, the memory cell 10 may be a 3T gain cell. For example, FIG. 8(B) and FIG. 8(C) show examples of a 3T gain cell. A memory cell 15 illustrated in FIG. 8(B) includes transistors M3 to M5, a capacitor C3, and a node SN3. The transistors M3 to M5 are a write transistor, a readout transistor, and a selection transistor, respectively. The transistor M3 is an OS transistor having a back gate, and the transistors M4 and M5 are p-channel Si transistors. The transistors M4 and M5 may each be an n-channel Si transistor or an OS transistor having a back gate. In a memory cell 16 illustrated in FIG. 8(C), three transistors are each an OS transistor having a back gate.

The node SN3 is a retention node. The capacitor C3 is a storage capacitor for retaining the voltage of the node SN3. A gate capacitance of the transistor M4 or the like may be used as the storage capacitor, and the capacitor C3 may be omitted intentionally. A fixed voltage (e.g., VDDD) is input to a wiring PDL. The wiring PDL is an alternative to the source line SL, and for example, the voltage VDDD is input.

The control circuit 251 has a function of controlling the entire operation of the NOSRAM 240. For example, the control circuit 251 performs a logical operation of the signals CE and WE to determine whether access from the outside is write access or readout access.

The row circuit 252 has a function of selecting the write word line WWL and the readout word line WBL in the row selected and specified by the address signal. The column circuit 253 has a function of writing data to the write bit line WWL in the column specified by the address signal and a function of reading out data from the readout bit line WBL in the column.

<DOSRAM>

A configuration example of a DOSRAM is described below. A DOSRAM refers to a RAM including a 1T1C memory cell and is an abbreviation for Dynamic Oxide Semiconductor RAM. A DOSRAM will be described below with reference to FIG. 9.

Figure 9A:
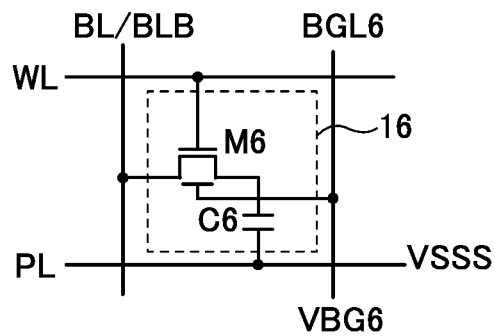
FIG. 9A: A circuit diagram illustrating a configuration example of a memory cell of a DOSRAM. B: A diagram illustrating an example of a layered structure of a DOSRAM.

As illustrated in FIG. 9(A), the memory cell 16 of a DOSRAM 350 is electrically connected to a bit line BL (or BLB), a word line WL, and wirings BGL6 and PL. The bit line BLB is an inverted bit line. For example, voltages VBG6 and VSSS are input to the wirings BGL6 and PL. The memory cell 16 includes a transistor M6 and a capacitor C6. The transistor M6 is an OS transistor having a back gate.

There is no limitation on the number of rewriting operations of the DOSRAM 350 in principle because data is rewritten by charging and discharging of the capacitor C6; and data can be written and read out with low energy. In addition, the memory cell 16 has a simple circuit configuration, and thus the capacity can be easily increased. Since the write transistor of the memory cell 16 is an OS transistor, the retention time of the DOSRAM 350 is significantly longer than that of a DRAM. This allows less frequent refresh or makes refresh operations unnecessary; thus, the power needed for refresh operations can be reduced.

Figure 9B:
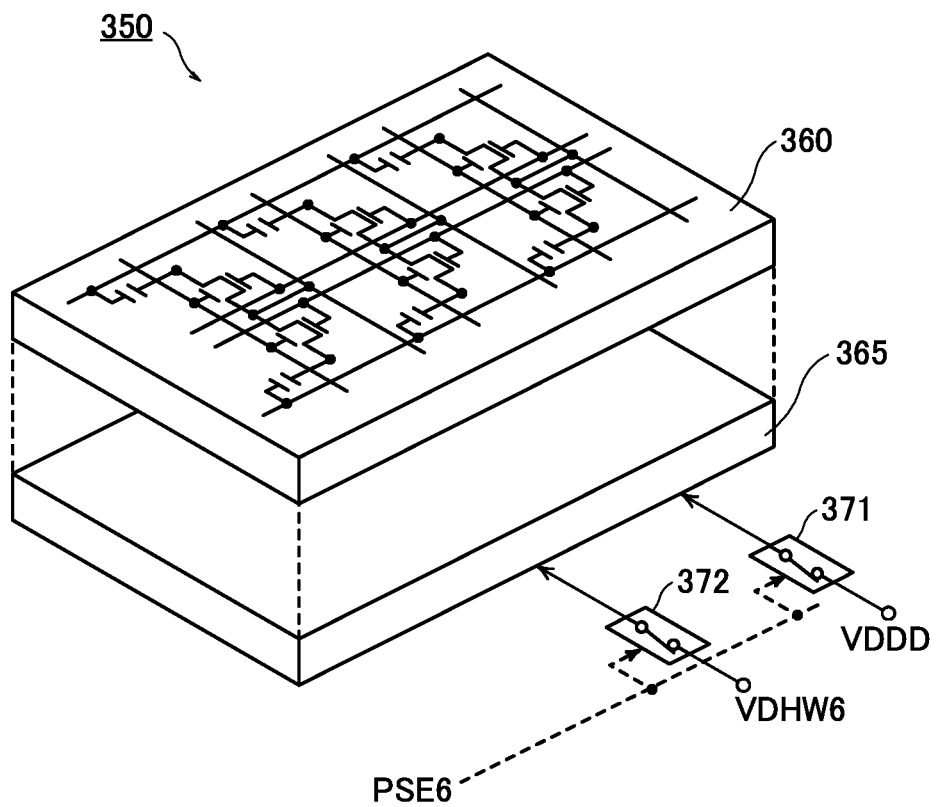

As illustrated in FIG. 9(B), in the DOSRAM 350, a memory cell array 360 can be stacked over a peripheral circuit 365. This is because the transistor M6 of the memory cell 16 is an OS transistor.

In the memory cell array 360, a plurality of memory cells 16 are arranged in a matrix, and the bit lines BL and BLB, the word line WL, and the wirings BGL6 and PL are provided according to the arrangement of the memory cells 16. A control circuit, a row circuit, and a column circuit are provided in the peripheral circuit 365. The row circuit selects the word line WL that is to be accessed, for example. The column circuit performs writing and reading out of data to and from a bit line pair formed of BL and BLB, for example.

Power switches 371 and 372 are provided in order to power gate the peripheral circuit 365. The power switches 371 and 372 control the input of voltages VDDD and VDHW6, respectively, to the peripheral circuit 365. Note that the voltage VDHW6 is a high-level voltage for the word line WL. On/off of the power switches 371 and 372 is controlled with a signal PSE6. For example, the signal PSE6 is generated by a PMU (Power Management Unit).

This embodiment can be implemented in appropriate combination with the other embodiments.

Embodiment 4

In this embodiment, examples of vehicles each including a plurality of secondary batteries are described.

The use of a plurality of secondary batteries in vehicles enables production of next-generation clean energy vehicles such as hybrid electric vehicles (HEVs), electric vehicles (EVs), and plug-in hybrid electric vehicles (PHEVs).

Figure 10A:
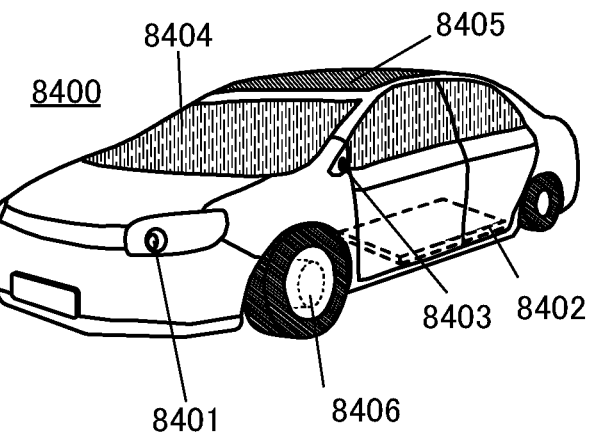
FIG. 10 Diagrams illustrating examples of electronic devices.

FIG. 10 illustrates examples of a vehicle using the lifetime estimation portion of the secondary battery of one embodiment of the present invention. A vehicle 8400 illustrated in FIG. 10(A) is an electric vehicle that runs on an electric motor as a power source. Alternatively, the vehicle 8400 is a hybrid electric vehicle capable of driving appropriately using either an electric motor or an engine as a power source. The vehicle 8400 includes a windshield 8404, a solar cell 8405, a side mirror camera 8403, and a battery pack 8402. The vehicle 8400 includes a plurality of secondary batteries in the battery pack 8402. When an IC equipped with the lifetime estimation portion is mounted as a protective circuit of the secondary batteries, neural network processing for detecting abnormality of the secondary batteries can be performed. Even in the vehicle 8400 using 1000 or more secondary batteries, the neural network processing for detecting abnormality of the secondary batteries can be efficiently performed. As the secondary batteries, many small cylindrical secondary batteries are arranged to be used in a floor portion of the vehicle. A battery pack in which a plurality of laminated secondary batteries are combined may be placed in the floor portion of the vehicle. The secondary batteries are used not only for driving an electric motor 8406, but also for supplying electric power to a light-emitting device such as a headlight 8401 or a room light (not illustrated).

The secondary batteries can also supply electric power to a display device of a speedometer, a tachometer, or the like included in the vehicle 8400. Furthermore, the secondary batteries can supply electric power to a semiconductor device included in the vehicle 8400, such as a navigation system.

Figure 10B:
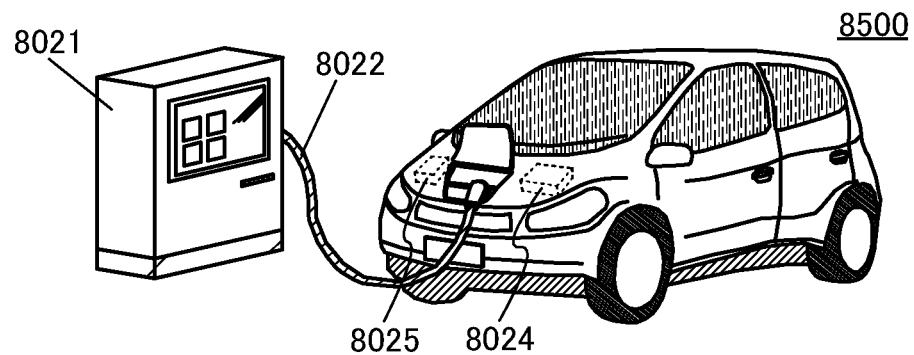

A vehicle 8500 illustrated in FIG. 10(B) can be charged when a secondary battery included in the vehicle 8500 is supplied with electric power from external charging equipment by a plug-in system, a contactless power feeding system, or the like. FIG. 10(B) illustrates the state in which a secondary battery 8024 included in the vehicle 8500 is charged with a ground-based charging apparatus 8021 through a cable 8022. In charging, a given method such as CHAdeMO (registered trademark) or Combined Charging System may be employed as a charging method, the standard of a connector, or the like as appropriate. The charging apparatus 8021 may be a charging station provided in a commerce facility or a power source in a house. With the use of a plug-in technique, the secondary battery 8024 included in the vehicle 8500 can be charged by being supplied with electric power from the outside, for example. The charging can be performed by converting AC electric power into DC electric power through a converter included in the charging apparatus 8021, such as an AC-DC converter. When provided with an AC-DC converter for charging 8025, the vehicle 8500 can be charged even when an AC power source is connected. When an IC equipped with the lifetime estimation portion is mounted on the charging apparatus 8021, neural network processing for detecting abnormality of the secondary battery of the vehicle 8500 can be performed.

Although not illustrated, a power receiving device may be provided in the vehicle so that it can be charged by being supplied with electric power from an above-ground power transmitting device in a contactless manner. In the case of the contactless power feeding system, by fitting a power transmitting device in a road or an exterior wall, charging can be performed not only when the vehicle is stopped but also when driven while the vehicle approaches the location in which the power transmitting device is fitted. In addition, the contactless power feeding system may be utilized to perform transmission and reception of electric power between vehicles. A solar cell may be provided in the exterior of the vehicle to charge the secondary battery when the vehicle stops or moves. To supply electric power in such a contactless manner, an electromagnetic induction method or a magnetic resonance method can be used.

Figure 10C:
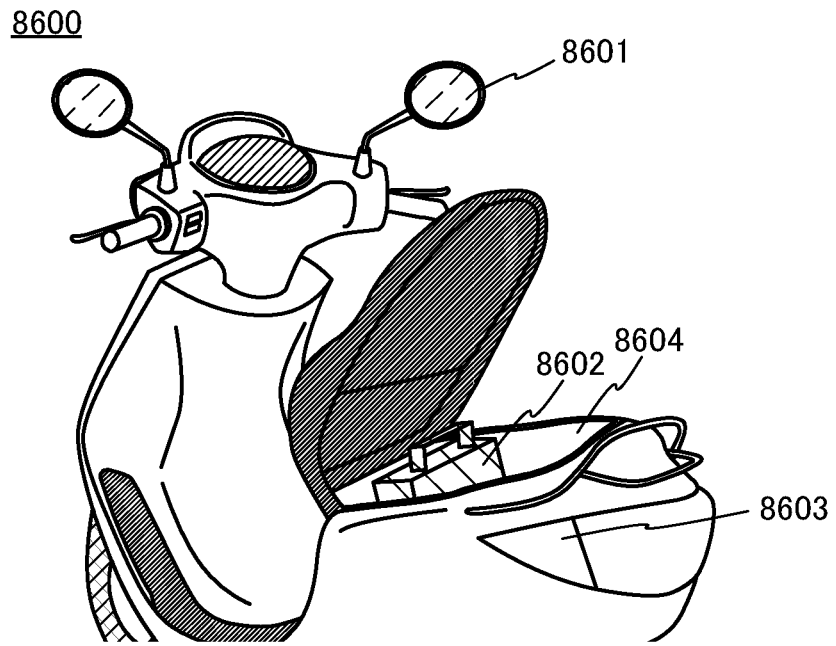

FIG. 10(C) illustrates an example of a motorcycle including an IC equipped with the lifetime estimation portion. A motor scooter 8600 illustrated in FIG. 10(C) includes a secondary battery 8602, side mirrors 8601, and indicator lights 8603. The secondary battery 8602 can supply electric power to the indicator lights 8603. The abnormality of the secondary battery 8602 can be detected by the IC equipped with the lifetime estimation portion.

Furthermore, in the motor scooter 8600 illustrated in FIG. 10(C), the secondary battery 8602 can be stored in a storage unit under seat 8604. The secondary battery 8602 can be stored in the storage unit under seat 8604 even with a small size. The secondary battery 8602 is detachable; thus, the secondary battery 8602 is carried indoors when charged, and is stored before the motor scooter is driven.

Furthermore, the secondary battery included in the vehicle can be used as a power source for supplying electric power to products other than the vehicle. In such a case, the use of a commercial power source can be avoided at peak time of electric power demand, for example. Avoiding the use of a commercial power source at peak time of electric power demand can contribute to energy saving and a reduction in carbon dioxide emissions.

REFERENCE NUMERALS

10: memory cell, 15: memory cell, 16: memory cell, 210: lifetime estimation device, 211: microcomputer, 212: storage unit, 213: capacity measurement unit, 214: temperature sensing unit, 215: lifetime estimation portion, 220: secondary battery, 230: lifetime estimation device, 240: NOSRAM, 242: power domain, 243: power domain. 245: power switch, 246: power switch, 247: power switch, 250: memory cell array, 251: control circuit, 252: row circuit, 253: column circuit, 350: DOSRAM, 360: memory cell array, 365: peripheral circuit, 371: power switch, 372: power switch. 7000: electronic component, 7000a: electronic component, 7000b: electronic component, 7001: lead, 7002: printed board, 7004: circuit board, 7005: silicon interposer. 7006: bump, 7007: bump, 7100: semiconductor wafer, 7102: circuit region, 7104: separation region, 7106: separation line, 7110: chip, 8021: charging apparatus, 8022: cable, 8024: secondary battery, 8025: AC-DC converter for charging, 8400: vehicle, 8401: headlight, 8402: battery pack, 8403: side mirror camera, 8404: windshield. 8405: solar cell, 8406: electric motor, 8500: vehicle, 8600: motor scooter, 8601: side mirror, 8602: secondary battery, 8603: indicator light, 8604: storage unit under seat

The invention claimed is:

1. A lifetime estimation device of a secondary battery, comprising:
   a measuring unit measuring a capacity of a secondary battery in a full charging state;
   a temperature sensing unit sensing ambient temperature of the secondary battery;

a storage unit storing a table of a proportional coefficient corresponding to temperature; and a microcomputer calculating a predicted deterioration line of the secondary battery with use of a nonlinear regression equation approximated to a measured deterioration line obtained by the measuring unit, wherein the nonlinear regression equation is represented by:

$$\text{State of Health(SOH)} = 100 - a \times \sqrt{\text{Cyclenumber}} - b \times (\text{Cycle number})^2,$$

wherein the SOH means a capacity retention rate to an initial capacity of the secondary battery, represented by percentage, wherein the Cycle number means a number of a pair of charge and discharge of the secondary battery, wherein each of parameters a and b represents a positive number, and wherein the table of the proportional coefficient comprises parameters a and b.

2. The lifetime estimation device of a secondary battery according to claim 1, wherein the nonlinear regression equation comprises a first proportional coefficient represented by parameter a and a second proportional coefficient represented by parameter b, and wherein the storage unit is configured to store a table of the first proportional coefficient and a table of the second proportional coefficient.

3. The lifetime estimation device of a secondary battery according to claim 2, wherein each of the first proportional coefficient and the second proportional coefficient is a deterioration factor.

4. The lifetime estimation device of a secondary battery according to claim 1, wherein the storage unit is a database.

* * * * *